(12) United States Patent
Kim et al.

(10) Patent No.: US 6,882,103 B2
(45) Date of Patent: Apr. 19, 2005

(54) PANEL OF ORGANIC ELECTROLUMINESCENCE DEVICE AND METHOD FOR MANUFACTURING THE SAME

(75) Inventors: Chang Nam Kim, Seoul (KR); Hak Su Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 13 days.

(21) Appl. No.: 10/270,538

(22) Filed: Oct. 16, 2002

(65) Prior Publication Data

US 2003/0076030 A1 Apr. 24, 2003

(30) Foreign Application Priority Data

Oct. 18, 2001 (KR) ..................... P2001-64407

(51) Int. Cl.$^7$ ............. H05B 33/00; H01J 1/62
(52) U.S. Cl. ............ 313/504; 313/505; 313/506; 345/76
(58) Field of Search ............. 313/491, 483, 313/504–506, 498; 345/45, 76; 428/917

(56) References Cited

U.S. PATENT DOCUMENTS 6,157,127 A * 12/2000 Hosokawa et al. ......... 313/506
6,339,289 B1 * 1/2002 Fork ....................... 313/506
6,525,467 B1 * 2/2003 Eida et al. ................ 313/506
6,611,095 B1 * 8/2003 Kim ........................ 313/505
6,621,213 B1 * 9/2003 Kawashima ............... 313/506
2003/0038591 A1 * 2/2003 Kim ........................ 313/504
2003/0038592 A1 * 2/2003 Kim ........................ 313/504

FOREIGN PATENT DOCUMENTS

| JP | 2000-294371 | 10/2000 |
|---|---|---|
| JP | 2001-68267 | 3/2001 |
| JP | 2001-185351 | 7/2001 |
| JP | 2001-217081 | 8/2001 |
| WO | WO 01/47322 A1 | 6/2001 |

* cited by examiner

Primary Examiner—Ashok Patel
(74) Attorney, Agent, or Firm—Fleshner & Kim LLP (57) ABSTRACT

A panel of an organic electro-luminescence (EL) device and a method for manufacturing the same is disclosed, in which it is possible to decrease a load in a scan driver (driving chip for the scan) and a pixel, thereby improving reliability of a driving driver and the device. Also, the number of the scan and data drivers (driving chip for the data) decreases, and the number of COF (chip on flexible printed circuit) bonding, chip bonding for connecting the driving chip to each electrode line, decreases, thereby decreasing a manufacturing price.

20 Claims, 5 Drawing Sheets

FIG. 1

(Related Art)

FIG. 4A third pixel array   Second pixel array   first pixel array

FIG. 4B

FIG. 5A third pixel array | Second pixel array | first pixel array

FIG. 5B

PANEL OF ORGANIC ELECTROLUMINESCENCE DEVICE AND METHOD FOR MANUFACTURING THE SAME

This application claims the benefit of the Korean Application No. 2001-64407 filed on Oct. 18, 2001, which is hereby incorporated by reference.

BACKGROUND OF THE INVENTION

1. Field of the Invention

The present invention relates to a display device, and more particularly, to a panel of an organic EL (electroluminescence) display and a method for manufacturing the same.

2. Discussion of the Prior Art

As a size of a display device increases greatly, a flat panel type display panel occupying a small space attracts an attention. Especially, many efforts have been made to study for manufacturing a flat display panel using organic electroluminescent materials.

Organic EL display panels are divided into a passive matrix type panel and an active matrix type panel in accordance with driving methods. In the passive matrix type display panel, scan and data electrode lines are respectively arranged in rows and columns lines, and pixels are formed at crossing points of the scan and data electrode lines. In the related art organic EL display panel, the pixels are formed at the crossing points of the scan and data electrode lines crossing with each other in a matrix form. The organic EL display panel further includes scan and data drivers, which respectively apply currents to the scan and data electrodes so as to make the pixels emit light.

A process for manufacturing the organic EL display panel includes the steps of preparing a transparent lower substrate, forming a transparent electrode as a first electrode (anode) on the transparent lower substrate, forming an organic layer on the first electrode, forming a second electrode (cathode) using a metal compound on the organic layer, and forming a protecting layer on the second electrode.

The transparent lower substrate does not conduct electricity since the transparent lower substrate is made of a glass material. For this reason, an indium tin oxide (ITO) material is coated on the transparent lower substrate so as to obtain electro-conductivity. At this time, the ITO material is coated on the transparent lower substrate after forming a metal supplementary electrode in that the ITO material has a high resistance value.

Subsequently, a barrier is formed thereon, and an organic material is deposited on an entire surface of the organic EL display panel, thereby forming the organic layer. The scan electrode is formed on the organic layer with the metal compound, thereby completing the manufacturing process of the organic EL display panel.

In the related art passive matrix type organic EL display panel, the number of pixels increases as the panel has higher resolution. Accordingly, the number of the scan and data electrode lines required for forming more pixels increases as well. If the number of the respective electrode lines increases, a time for one pixel to emit light is reduced. Since the luminescent time for unit time of each pixel is reduced in inverse proportion to the increase of the number of the respective electrode lines, instant brightness should become higher in order to overcome such a problem.

Figure 1:
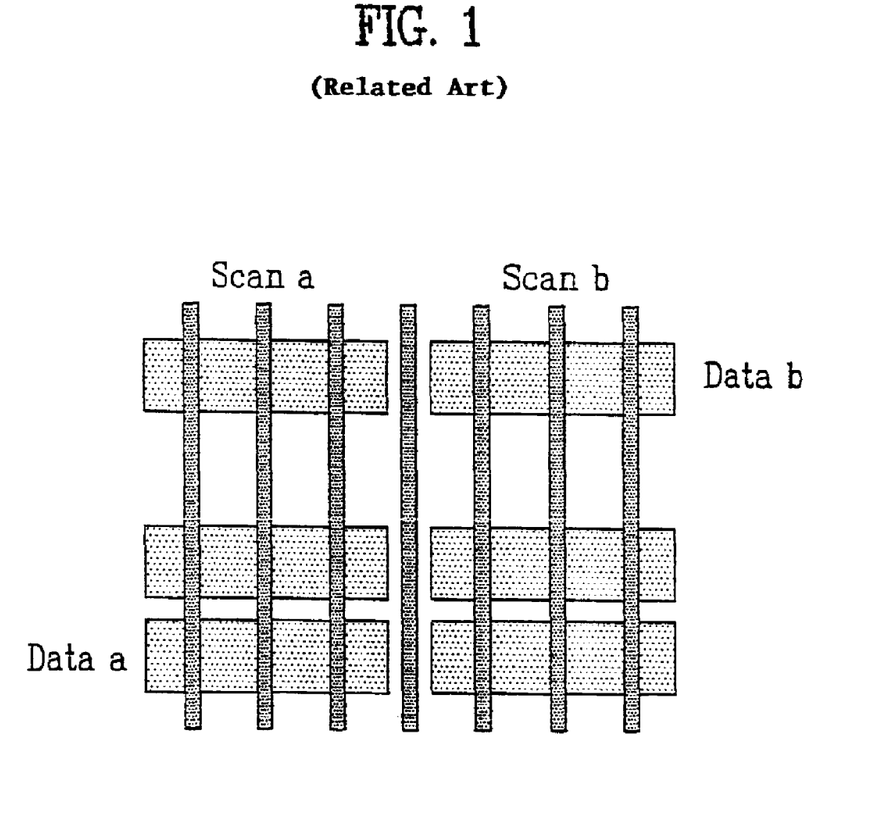
FIG. 1 is a view illustrating a structure of a prior art passive matrix organic EL device.

FIG. 1 illustrates a structure of a related art passive matrix type organic EL display panel for solving the aforementioned problem.

Referring to FIG. 1, a first electrode strip (anode strip) is divided into halves. That is, a single electrode strip is divided into two strips, and each of the two strips is scan-driven independently. Accordingly, the number of scan for each strip is reduced in half, thereby improving a light-emitting efficiency and a device life.

However, the related art organic EL display panel has the following disadvantages.

In the structure of the related art organic EL display panel, the data electrode is divided into two parts, so that the data drivers for applying currents to the data electrodes have to be formed at both parts of the strip, respectively, thereby increasing a product cost of the organic EL display panel as well as reducing a manufacturing efficiency.

SUMMARY OF THE INVENTION

Accordingly, the present invention is directed to a panel of an organic EL device and a method for manufacturing the same that substantially obviates one or more problems due to limitations and disadvantages of the prior art.

An object of the present invention is to a panel of an organic EL device and a method for manufacturing the same, in which a data electrode line is divided into two strips according to a row direction, a width direction, thereby preventing a driver chip and a pixel from being burdened.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL panel according to the present invention includes a first electrode being divided into two strips according to a row direction, a width direction; a second electrode formed in a column direction being perpendicular to the first electrode for being crossed with the first electrode, thereby forming a plurality of pixels; and a barrier formed between pixel arrays for electrically insulating one pixel array being formed by crossing the plurality of first electrodes to one second electrode from another pixel array being adjacent.

Preferably, the first electrode is divided into two strips, and each one end of the two strips being connected to a data driver is formed at one side of a panel.

Preferably, the organic EL panel according to the present invention further includes two supplementary electrodes as one set being formed in perpendicular to the pixel array under the first electrode, for being corresponding to each pixel of the pixel arrays.

Preferably, one of the supplementary electrodes is connected to one pixel of an odd numbered pixel array, and the other is connected to one pixel of an even numbered pixel array being corresponding to the odd numbered pixel array.

Preferably, the organic EL panel according to the present invention further includes an insulating layer for the supplementary electrodes including a via hole for exposing a predetermined portion of the supplementary electrode formed as two lines.

Preferably, the second electrode is electrically connected to each pixel array formed in one direction, and a pair of pixel arrays being adjacent are simultaneously scan-driven.

Preferably, a pair of scan electrodes are synchronized at a same level by one signal so as to scan-drive the pair of pixel arrays being adjacent, simultaneously.

In another aspect of the present invention, an organic EL device according to the present invention includes a first electrode being divided into two strips in a row direction, a width direction; a supplementary electrode formed on the first electrode for being partially overlapped with the first electrode; an organic luminescent layer formed on the first electrode for being overlapped with the first electrode; a second electrode formed on the organic luminescent layer in a column direction being perpendicular to the first electrode, for being scan-driven; and a barrier for insulating the second electrodes from one another according to unit pixel array, the unit pixel array being formed by crossing the plurality of first electrode to one second electrode.

Preferably, the first electrode is divided into lower and upper lines at portions being crossed with the second electrode, the lower and upper lines being alternately extended upward or downward.

A method for manufacturing an organic EL panel according to the present invention includes (a) forming two supplementary electrode lines as one set on a transparent substrate; (b) forming an insulating layer for the supplementary electrode including a via hole, which is formed on the supplementary electrode lines for exposing a predetermined portion of the supplementary electrode lines; (c) forming the first electrode being divided into two lines by patterning a conductive material on the insulating layer for the supplementary electrodes; (d) forming an insulating layer for covering an edge of the first electrode; and (e) forming a barrier for insulating second electrodes from one another according to unit pixel arrays.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Prior to the explanation of the present invention, a first electrode indicates an anode or a data electrode, and a second electrode indicates a cathode or a scan electrode. An organic EL device panel has a double scan structure as well as a passive matrix type having a plurality of pixels formed at crossing points of first and second electrodes.

A panel of an organic EL device and a method for manufacturing the same according to the present invention will be explained with reference to the accompanying drawings.

Figure 2:
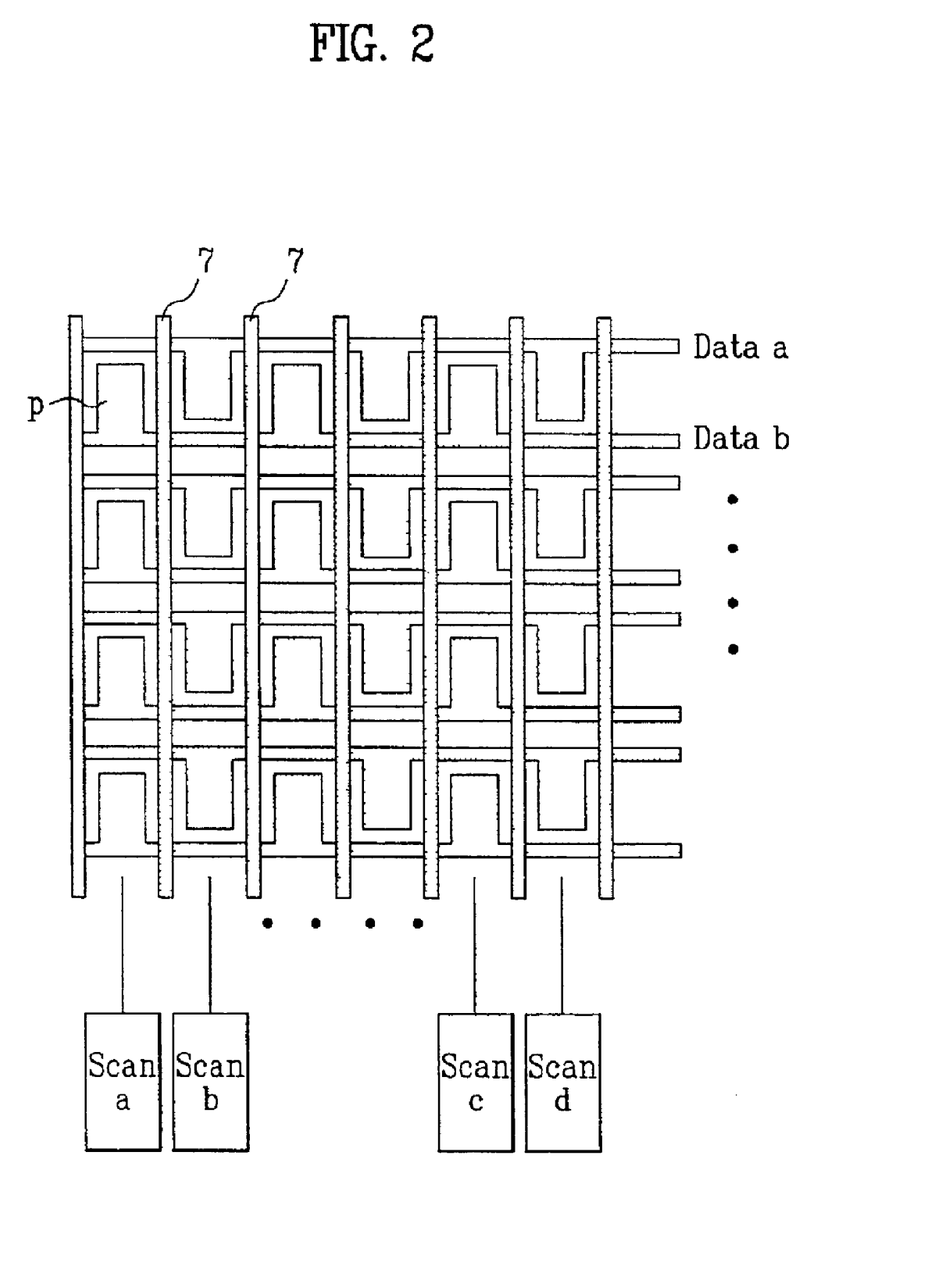
FIG. 2 is a view illustrating a double scan structure of an organic EL device according to the present invention.

FIG. 2 is a view illustrating a double scan structure organic EL device according to the present invention.

As shown in FIG. 2, a first electrode strip (anode strip) is divided into two strips in a row direction, a width direction. That is, a data electrode line is divided into 'Data a' and 'Data b' in the row direction. In an entire panel, each one end of the first electrode (data electrode) lines connected to driver chips is positioned at one side of the panel in the organic EL device.

The first electrode strip is divided into lower and upper lines, in which the lower and upper lines respectively extends upwardly or downwardly at portions being crossed with the second electrode. That is, in an odd numbered portion of the first electrode strip being crossed with the second electrode according to the row direction, the upper line of the first electrode strip extends downwardly. Meanwhile, in an even numbered portion of the first electrode strip being crossed with the second electrode according to the row direction, the lower line of the first electrode strip extends upwardly. At this time, since the portion of the first electrode strip being extended upwardly or downwardly is crossed with the second electrode so as to form the pixel, the portion of the first electrode strip being extended upwardly or downwardly is largely formed. Accordingly, the current is applied to the line of the first electrodes strip being extended upwardly or downwardly so as to emit light in the pixel. For example, in the odd numbered portion of the first electrode strip being crossed with the second electrode according to the row direction, the current is applied to the upper line of the first electrode strip, and is not applied to the lower line of the first electrode strip since the upper line of the first electrode strip extends downwardly. Meanwhile, in the even numbered portion of the first electrode strip being crossed with the second electrode according to the row direction, the current is applied to the lower line of the first electrode strip, and is not applied to the upper line of the first electrode strip since the lower line of the first electrode strip extends upwardly.

The organic EL device having the structure mentioned in FIG. 2 is driven by one data driver and one scan driver.

The plurality of pixels forms a unit pixel array in a column direction being perpendicular to the data electrode line. The plurality of pixel arrays are disposed in the row direction. That is, one scan electrode line cross to the plurality of data electrode lines, thereby forming one pixel array. Then, the plurality of pixel arrays are disposed in a direction at which the scan electrode lines are formed. At this time, a barrier 7 is formed at each pixel array in the column direction being perpendicular to the data electrode line.

The data electrode lines 'Data a' and 'Data b' are electrically connected to the data driver applying data signals, and the scan electrode lines are electrically connected to the scan driver applying scan signals for simultaneously driving two pixel arrays adjacent to each other. The barrier 7 electrically insulates the pixel arrays being adjacent from each other.

Each pixel array being insulated by the barrier 7 is electrically connected to one scan electrode line, and the two scan electrode lines being adjacent are synchronized by one scan signal, thereby applying a current. Accordingly, the pixel arrays being adjacent are simultaneously driven by one scan signal.

As shown in FIG. 2 illustrating the double scan structure according to the present invention, the number of the scan electrode lines for being electrically connected to the scan driver (driving chip for the scan) does not decrease in half. Meanwhile, the two signals are synchronized for being simultaneously applied to two scan electrode lines being adjacent to each other, so that it is possible to decrease an amount of the current being applied to the scan electrode line in half, thereby decreasing a load to the scan driver (driving chip for the scan) and the pixel.

In the double scan structure according to the present invention shown in FIG. 2, another embodiment for driving the pixel array will be explained as follows. First, the number of the scan electrode lines for being electrically connected to the scan driver (driving chip for the scan) decreases in half, and the current being applied to the scan electrode line is maintained in the same amount as the related art. However, the amount of the current being applied to each pixel array decreases in half as compared to the amount of the current being applied by the scan driver due to the barrier, thereby decreasing the load to the pixel array.

Figure 3:
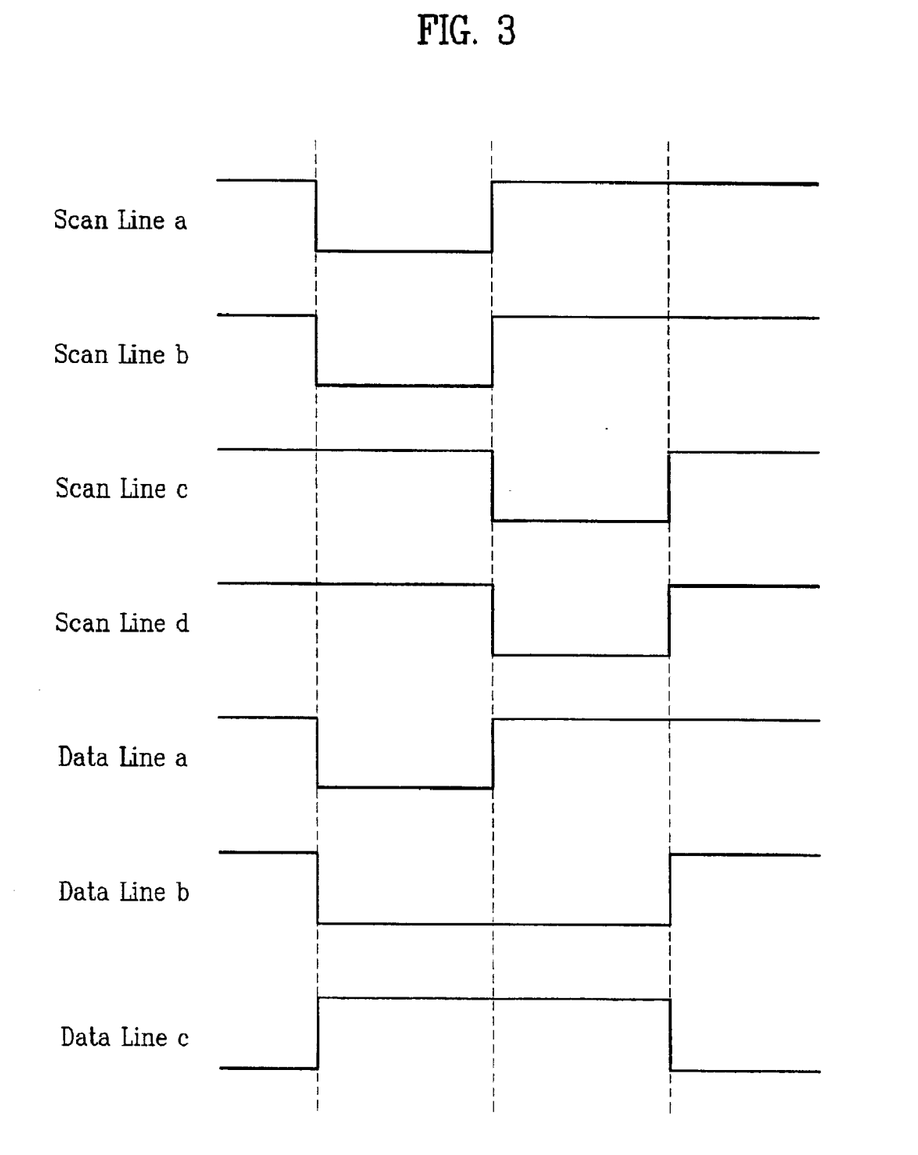
FIG. 3 is a timing view illustrating scan and data signals of an organic EL device according to the present invention.

FIG. 3 is a timing view illustrating scan and data signals of an organic EL device according to the present invention. An operation of the double scan structure shown in FIG. 2 will be explained with reference to FIG. 3.

First, 'scan a' and 'scan b' are simultaneously driven, and a current being suitable for 'data a' and 'data b' is applied. Two scan electrode lines making a pair are synchronized with one signal, and are scan-operated at the same level. For instance, 'scan a' is operated at the same level as 'scan b', and 'scan c' is operated at the same level as 'scan d'. At this time, 'scan a' and 'scan b' are separately formed, meanwhile, 'scan a' and 'scan b' are simultaneously driven, thereby performing a double scan.

As mentioned above, one pair of scan electrode lines being adjacent to each other is driven in a double scan structure. Also, the appropriate current is applied to the data electrode line at a desired time, thereby operating the device.

At this time, the amount of the current being applied to the scan electrode line decreases in half as compared with the related art double scan structure since the barrier 7 is disposed at each pixel array in the column direction being perpendicular to the data electrode line. In the present invention, the current is applied at the same amount as the related art in which the first electrode strip (anode strip) divided into two in the row direction, and the amount of the current being applied to the scan electrode line decreases in half.

Figure 4A:
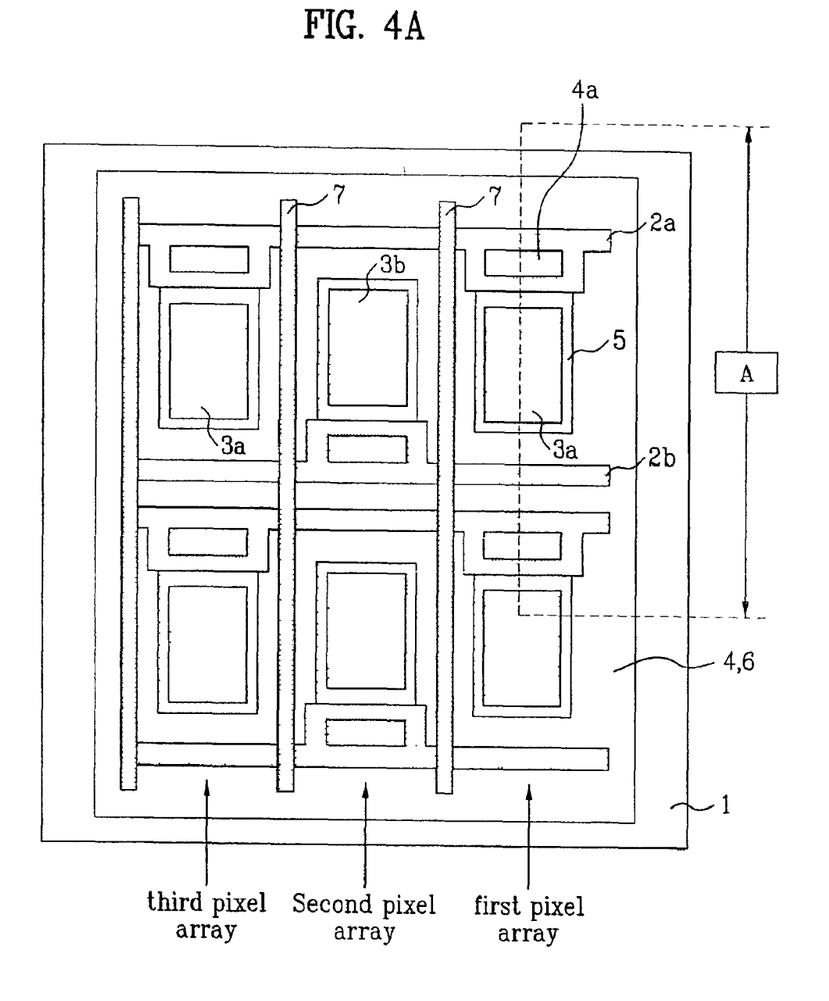
FIG. 4A and FIG. 4B are respectively plan and sectional views illustrating an organic EL device having a double scan structure according to the first embodiment of the present invention.
Figure 4B:
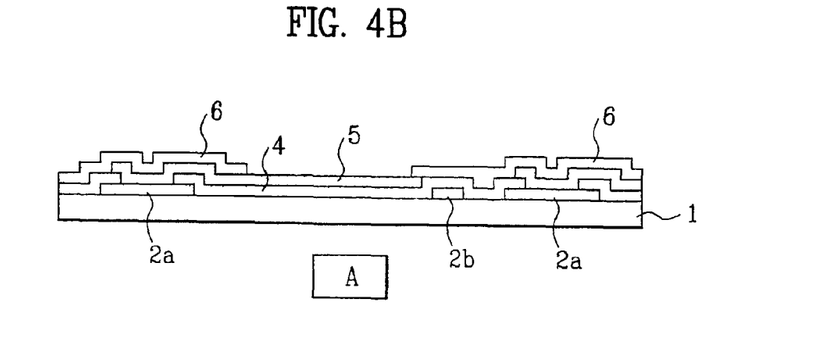

FIG. 4A and FIG. 4B are respective plan and sectional views of an organic EL device having a double scan structure according to the first embodiment of the present invention, in which supplementary electrodes 2a and 2b are formed under the first electrode 5. As shown in FIG. 4A and FIG. 4B, an insulating layer 4 for the supplementary electrodes is formed after forming the supplementary electrodes 2a and 2b so as to form the first electrode 5 in a large size, thereby improving an aperture ratio of the pixel.

The plurality of pixels are formed at crossing points of the first electrode 5 and the second electrode (not shown) in the organic EL device according to the present invention. The plurality of pixels form a pixel array in the column direction being perpendicular to the first electrode 5, and the plurality of pixel arrays forming the pairs are disposed in the row direction. Especially, the two pixel arrays forming the pair in the column direction are simultaneously scan-driven. For example, in the pixel arrays being arranged in one direction, the first pixel 3a of the odd numbered pixel array and the first pixel 3b of the even numbered pixel arrays are simultaneously scan-driven.

In the organic EL device shown in FIG. 4A and FIG. 4B, the pixel arrays forming the pairs in two lines are formed on a transparent substrate 1 in one direction. That is, one pixel array is arranged, and the other pixel array is arranged for being parallel to the pixel array, thereby forming the pixel arrays forming the pairs in two lines.

The supplementary electrodes 2a and 2b are formed in perpendicular to the arranged pixel arrays for being corresponding to each pixel of the pixel arrays, thereby forming two supplementary electrode lines. At this time, one pixel is connected to any one of the supplementary electrode lines 2a and 2b. As shown in the drawings, the supplementary electrode 2a is connected to the first pixel 3a of the odd numbered pixel array, and the other supplementary electrode 2b is connected to the first pixel 3b of the even numbered pixel array. The first electrode 5 formed in the row direction is patterned on the first pixel 3a of the odd numbered pixel array and the first pixel 3b of the even numbered pixel array. Also, the first electrode 5 is formed for being simultaneously connected to the supplementary electrodes 2a and 2b.

An organic luminescent layer (not shown) is formed on the first electrode 5, and the second electrode (not shown) is formed on the organic luminescent layer. At this time, the first electrode 5 crosses to the second electrode (not shown). The barrier 7 is arranged at each pixel array formed in one direction so as to insulate the second electrodes (not shown) from one another according to the unit pixel arrays. The insulating layer 4 for the supplementary electrode is formed on the supplementary electrodes 2a and 2b for electrically controlling the pixels 3a and 3b forming the pair. Then, the insulating layer 6 is formed on the transparent substrate 1 for covering an edge of the first electrode 5.

FIG. 4A and FIG. 4B illustrate a method for manufacturing the organic EL device.

First, the supplementary electrodes 2a and 2b of the two lines are formed on the first substrate 1 as one set. The supplementary electrodes 2a and 2b are arranged in the column direction for being perpendicular to the pixel arrays arranged in the row direction. The two lines of the supplementary electrodes 2a and 2b are formed for being corresponding to each pixel of the pixel arrays. That is, the supplementary electrode 2a is connected to the first pixel 3a of the odd numbered pixel array (first pixel array), and the other supplementary electrode 2b is connected to the first pixel 3b of the even numbered pixel array (second pixel array).

Subsequently, the insulating layer 4 for the supplementary electrode having a via hole 4a is formed, so that the supplementary electrodes 2a and 2b electrically control the pixels 3a and 3b forming the pair, and the two lines of the supplementary electrodes 2a and 2b being adjacent are exposed at a predetermined portion. At this time, the via hole 4a is formed for electrically connecting the one supplementary electrode 2a out of the supplementary electrodes 2a and 2b to the first electrode 5.

Subsequently, a transparent conductive material is patterned from forming the first electrode 5. The first electrode 5 is formed on the pixels 3a and 3b forming the pair, and are formed on the supplementary electrode 2a including the via hole 4a. The insulating layer 6 is formed on the transparent substrate 1 for covering the edge of the first electrode 5.

The barrier 7 is formed on the insulating layer 6 for simultaneously scan-driving the pair of the pixel arrays arranged in one direction. The barrier 7 is formed for insulating the respective second electrodes (not shown) from one another according to the unit pixel arrays.

After forming the barrier 7 at each pixel array being in perpendicular to the supplementary electrodes 2a and 2b of the two lines, the organic luminescent layer (not shown) is formed on the first electrode 5. Then, the second electrode (not shown) is formed on the organic luminescent layer (not shown).

After forming the organic luminescent layer and the second electrode, a process for passivation and encapsulation is performed for forming a passivation layer, thereby completing a process for forming the device.

Figure 5A:
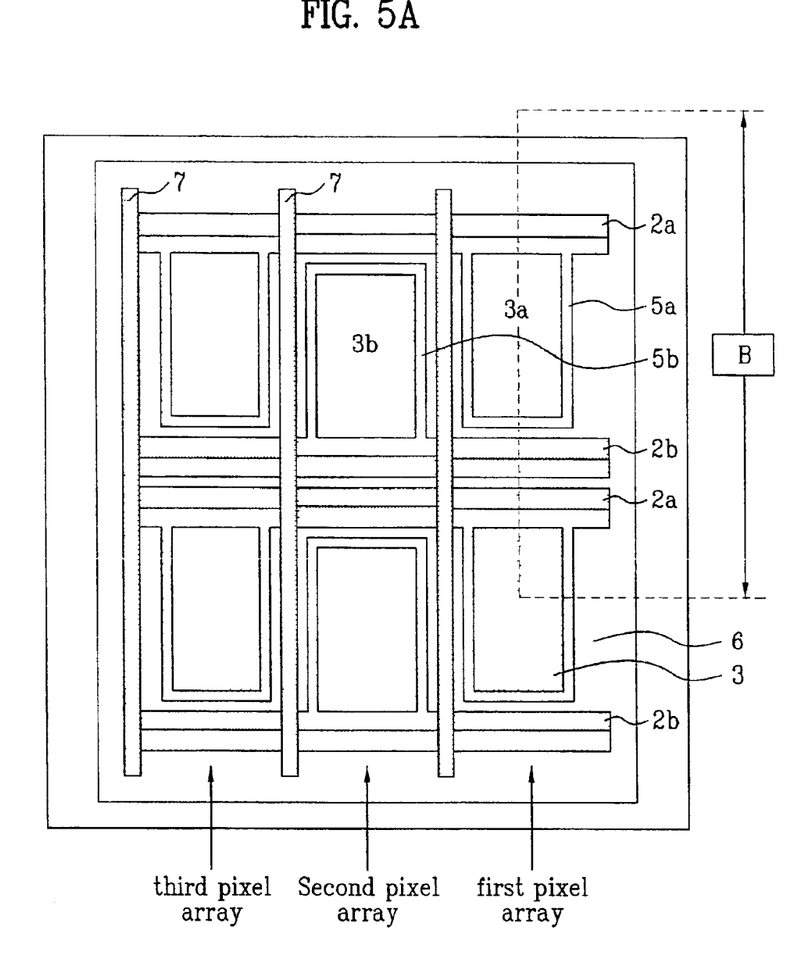
FIG. 5A and FIG. 5B are respectively plan and sectional views illustrating an organic EL device having a double scan structure according to the second embodiment of the present invention.
Figure 5B:
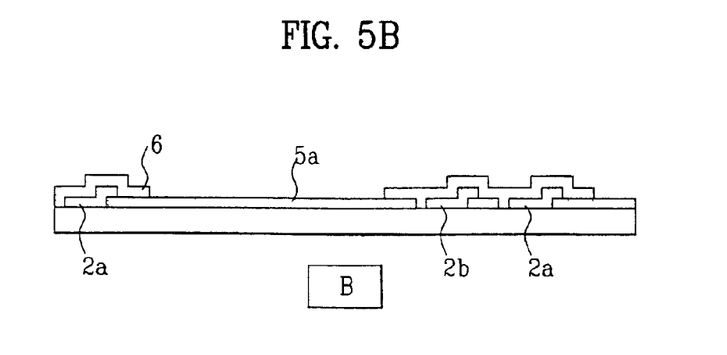

FIG. 5A and FIG. 5B are plan and sectional views of an organic EL device having a double scan structure according to the second embodiment of the present invention. In the organic EL device having the double scan structure according to the second embodiment of the present invention, supplementary electrodes 2a and 2b are formed on first electrodes 5a and 5b.

In the organic EL device according to the second embodiment of the present invention, a plurality of pixels are formed at crossing points of first and second electrodes.

The plurality of pixels are formed in a column direction being perpendicular to the first electrode 5, thereby forming one pixel array. Then, the plurality of pixel arrays forming the pairs in a row direction are formed. Especially, the two pixel arrays forming the pair in the row direction are simultaneously scan-driven.

In the organic EL device shown in FIG. 5A and FIG. 5B, the pixel arrays forming the pair as two lines are formed on a transparent substrate 1 in one direction. That is, one pixel array is arranged, and then the other pixel array is formed in parallel to the pixel array, thereby arranging the pixel arrays forming the pair as the two lines.

The first electrodes 5a and 5b are formed at the same direction in which the pixel arrays are formed. Also, the first electrodes 5a and 5b are formed in two lines for being corresponding to each pixel of the pixel arrays. At this time, one pixel is connected to any one of the first electrodes 5a and 5b. As shown in the drawings, the first electrode 5a is connected to the first pixel 3a of the odd numbered pixel array (first pixel array), and the other first electrode 5b is connected to the first pixel 3b of the even numbered pixel array (second pixel array).

The supplementary electrodes 2a and 2b are formed in perpendicular to the pixel arrays, and are formed as two lines for being corresponding to each pixel of the pixel arrays. At this time, one pixel is connected to any one of the supplementary electrode lines 2a and 2b. As shown in the drawings, the supplementary electrode 2a is connected to the first pixel 3a of the odd numbered pixel array (first pixel array), and the other supplementary electrode 2b is connected to the first pixel 3b of the even numbered pixel array (second pixel array).

The supplementary electrodes 2a and 2b are electrically connected to the first electrodes 5a and 5b, and more particularly, the supplementary electrodes 2a and 2b are partially overlapped with the first electrodes 5a and 5b. As shown in the drawings, the supplementary electrode 2a is overlapped with the first electrode 5a being connected to the first pixel 3a of the odd number pixel array (first pixel array), and the supplementary electrode 2b is overlapped with the first electrode 5b being connected to the first pixel 3b of the even numbered pixel array (second pixel array).

An organic luminescent layer (not shown) is formed on the first electrodes 5a and 5b for being overlapped with the first electrodes 5a and 5b. The second electrode (not shown) is formed on the organic luminescent layer (not shown) for being scan-driven. Then, a barrier 6 is formed at each pixel array formed in one direction for insulating the second electrodes (not shown) from one another according to the unit pixel arrays.

An insulating layer 6 is formed on the transparent substrate 1 for covering edges of the first electrodes 5a and 5b. The insulating layer 6 insulates the first electrode 5a being connected to the first pixel 3a of the odd number pixel array (first pixel array) from the supplementary electrode 2b being connected to the first pixel 3b of the even numbered pixel array (second pixel array). Also, the first electrode 5b being connected to the first pixel 3b of the even numbered pixel array (second pixel array) is insulated from the supplementary electrode 2a being connected to the first pixel 3a of the odd numbered pixel array (first pixel array) due to the insulating layer 6.

In the EL devices according to the first and second embodiments of the present invention, the pair of pixel arrays are formed on the transparent substrate 1 in one direction with the two lines, and the pixel arrays are connected to the scan electrode (second electrode) for being simultaneously scan-driven. Also, the barrier 7 is formed at each pixel array for insulating the second electrodes from one another according to the unit pixel arrays. In other words, each second electrode is insulated from one another according to the unit pixel arrays, and the second electrodes being adjacent to each other are simultaneously scan-driven.

In the organic EL device according to the present invention, the supplementary electrodes 2a and 2b are made of a conductive material such as Cr, Mo, Al and Cu. Also, the supplementary electrodes may be made of an alloy of the aforementioned materials. At this time, the supplementary electrode is formed at a thickness of 0.01 μm to 10 μm, and a width of the supplementary electrode varies according to the characteristic of the device.

The insulating layer may be made of an inorganic material such as oxide $SiO_2$ or nitride $SiN_x$. The insulating layer may be made of an organic material such as polymer (polyacryl, polyimide, novolac, polyphenyl or polystylene). At this time, the insulating layer is formed at a thickness of 0.01 μm to 10 μm. Also, the insulating layer is made of a material having a low absorbance of light.

The first electrode of a luminescent area is covered with the insulating layer partially or completely. That is, the insulating layer is formed for covering the edge of the first electrode since the edge of the first electrode may be damaged during a process for preventing the first electrode from being shorted from the second electrode. The first electrode is covered with the insulating layer at 0.1 μm to 7 μm. The first electrode is a transparent electrode, and the second electrode is a metal electrode.

As mentioned above, the organic EL device and the method manufacturing the same has the following advantages.

The amount of the current being applied to the scan electrode line decreases in half, so that it is possible to decrease the load in the scan driver (driving chip for the scan) and the pixel, thereby improving reliability of the driving driver and the device.

Also, the pair of scan electrode lines that are respectively connected to the two scan drivers are simultaneously scan-driven, and each one end of the data electrode lines for being connected to the driving chip is formed at one side of the substrate, thereby decreasing duty in half.

Furthermore, the number of the scan and data drivers (driving chip for the data) decreases, and the number of COF (chip on flexible printed circuit) bonding, chip bonding for connecting the driving chip to each electrode line, decreases, thereby decreasing a manufacturing price.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. An organic EL panel comprising:
   a plurality of first electrodes having a length and being divided along the length into first and second strips, wherein the first electrodes are respectively disposed in rows substantially parallel to the length, and wherein the first electrodes are data electrodes;
   a plurality of second electrodes formed in a plurality of columns substantially perpendicular to and crossed with, the rows of first electrodes, thereby forming a plurality of pixels wherein pixels in a column form a pixel array;
   first and second supplementary electrodes respectively electrically coupled to the first and second strips; and
   a barrier formed between pixel arrays for electrically insulating adjacent pixel arrays.

2. The organic EL panel as claimed in claim 1, wherein each end of the first and second strips is connected to a data driver formed at one side of the EL panel.

3. The organic EL panel as claimed in claim 1, wherein the first and second supplementary electrodes are respectively electrically coupled to the first electrode at alternating pixels in a row.

4. The organic EL panel as claimed in claim 1, wherein the first supplementary electrode is connected to a pixel of an odd numbered pixel array, and the second supplementary electrode is connected to a pixel of an even numbered pixel array.

5. The organic EL panel as claimed in claim 1, further comprising an insulating layer for the supplementary electrodes, wherein the insulating layer comprises a via holes for exposing predetermined portions of the first and second supplementary electrodes.

6. The organic EL panel as claimed in claim 5, wherein via holes are formed to electrically connect the first and second supplementary electrodes to the first electrode.

7. The organic EL panel as claimed in claim 1, wherein the first and second supplementary electrodes are formed under the first electrodes, and are respectively patterned on one pixel of an odd numbered pixel array, and one pixel of an even numbered pixel array.

8. The organic EL panel as claimed in claim 1, further comprising an organic luminescent layer formed on the first electrode.

9. The organic EL panel as claimed in claim 8, wherein the second electrode is formed on the organic luminescent layer.

10. The organic EL panel as claimed in claim 1, wherein the second electrodes are electrically connected to each pixel array, and a pair of adjacent pixel arrays are simultaneously scan-driven.

11. The organic EL panel as claimed in claim 10, wherein the second electrodes comprise scan electrodes and a pair of adjacent scan electrodes are configured to respectively provide a first scan pulse and a second scan pulse so as to concurrently scan-drive the pair of adjacent pixel arrays.

12. The organic EL panel as claimed in claim 1, further comprising an insulating layer for covering an edge of the first electrode.

13. The organic EL panel as claimed in claim 12, wherein the barrier is formed on the insulating layer for insulating the second electrodes from one another according to the unit pixel arrays.

14. An organic EL panel comprising:
    a plurality of first electrodes divided into lower and upper strips in a row direction;
    a supplementary electrode formed on at least one first electrode and partially overlapped with the at least one first electrode;
    an organic luminescent layer formed on the first electrodes and overlapped with the first electrodes;
    a plurality of second electrodes formed on the organic luminescent layer in a column direction substantially perpendicular to the first electrodes for being scan-driven, wherein the lower and upper strips of the first electrodes alternately extend upward and downward; and
    a barrier for insulating the second electrodes from one another according to unit pixel arrays, a unit pixel array being formed by crossing the plurality of first electrodes to one second electrode.

15. The organic EL panel as claimed in claim 14, wherein the second electrode is connected to a scan driver for applying a current so as to simultaneously scan-drive a pair of adjacent pixel arrays.

16. The organic EL panel as claimed in claim 14, wherein the upper strip extends downwardly at an odd numbered portion of the first electrode being crossed with the second electrode, and the lower strip extends upwardly at an even numbered portion of the first electrode.

17. The organic EL panel as claimed in claim 16, wherein a current is applied to the upper strip at the odd numbered portion of the first electrode being crossed with the second electrode, and a current is applied to the lower strip at the even numbered portion of the first electrode.

18. A method for manufacturing an organic EL panel comprising:
    (a) forming two supplementary electrode lines as one set on a transparent substrate;
    (b) forming an insulating layer for the supplementary electrode lines including a via hole, which is formed on supplementary electrode lines for exposing a predetermined portion of the supplementary electrode lines;
    (c) forming a plurality of first electrodes, each divided into two strips by patterning a conductive material on the insulating layer for the supplementary electrodes, wherein the first electrodes are data electrodes;
    (d) forming an insulating layer for covering an edge of the first electrodes; and
    (e) forming a barrier for insulating second electrodes from one another according to unit pixel arrays.

19. The method as claimed in claim 18, wherein the first electrodes are formed such that they can be connected to the supplementary electrode through the via hole.

20. The method as claimed in claim 18, further comprising:

forming an organic luminescent layer on the first electrodes, and     forming the second electrodes on the organic luminescent layer.

* * * * *